(12) United States Patent
Borkar et al.

(10) Patent No.: US 6,741,107 B2
(45) Date of Patent: May 25, 2004

(54) SYNCHRONOUS CLOCK GENERATOR FOR INTEGRATED CIRCUITS

(75) Inventors: Shekhar Y. Borkar, Beaverton, OR (US); Matthew B. Haycock, Beaverton, OR (US); Stephen R. Mooney, Beaverton, OR (US); Aaron K. Martin, Hillsboro, OR (US); Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/802,584

(22) Filed: Mar. 8, 2001

(65) Prior Publication Data

US 2002/0125925 A1 Sep. 12, 2002

(51) Int. Cl.[7] .................................................. H03L 7/00
(52) U.S. Cl. ........................................ 327/153; 327/158
(58) Field of Search ................................. 327/149, 153, 327/158, 161, 270, 271, 276, 277, 284

(56) References Cited

U.S. PATENT DOCUMENTS

| | | | | | |
|---|---|---|---|---|---|
| 5,883,534 A | * | 3/1999 | Kondoh et al. | ............. | 327/156 |
| 5,936,912 A | * | 8/1999 | Kawabata et al. | .......... | 365/233 |
| 5,990,715 A | * | 11/1999 | Nishimura | ................... | 327/158 |
| 6,037,813 A | * | 3/2000 | Eto et al. | ..................... | 327/156 |
| 6,100,733 A | * | 8/2000 | Dortu et al. | ................ | 327/149 |
| 6,225,843 B1 | * | 5/2001 | Taniguchi et al. | .......... | 327/158 |

* cited by examiner

Primary Examiner—Timothy P. Callahan
Assistant Examiner—Cassandra Cox
(74) Attorney, Agent, or Firm—Fish & Richardson P.C.

(57) ABSTRACT

A synchronous clock generator for an integrated circuit is described in which a delay lock loop circuit may be used to delay a first input signal. A delay circuit is coupled to the delay lock loop circuit and receives a control voltage from the delay lock loop circuit, which is used to delay a second input signal. The first and second input signal may be complimentary.

20 Claims, 3 Drawing Sheets

SYNCHRONOUS CLOCK GENERATOR FOR INTEGRATED CIRCUITS

BACKGROUND OF THE INVENTION

The present invention relates generally to integrated circuits, and more particularly, to a synchronous clock generator used in such circuits.

Integrated circuits receive an input signal from an external device. The integrated circuit executes processing operations, and then generates an output signal. Clock signals are used to control the flow of the input signal into, through, and out of the integrated circuit. Operations on the input signal are often initiated at the edges of a clock signal.

Executing operations on an edge of a clock signal may be complex. Data may arrive substantially at the same time with the rising edge of the clock signal and may be immediately latched into data registers. The data, however, may require sufficient time to transition between high and low levels. Thus the data may not be latched during a large portion of a clock period during the transition period.

DETAILED DESCRIPTION

In general, the present invention describes a synchronous clock generator, which permits an input signal to be latched, when the input signal is stable. Stability may occur after the transient time required for the input signal to transition between high and low levels. The synchronous clock generator may include a delay lock loop circuit, which is referenced to an input clock signal, to delay the clock signal by a period and also produce a control signal. The control signal may be supplied to a delay circuit receiving an input clock signal that is complementary to the input clock signal. The delay circuit may be used to delay the complementary clock signal by a period that is substantially the same as the delay caused by the delay lock loop circuit. The delayed clock signals may then be used to latch an input signal into a latch circuit, which allows the signals to stabilize. The synchronous clock generator may reduce the amount of area occupied on an integrated circuit, and may also reduce power consumption. Moreover, the synchronous clock generator may minimize the number of electrical components to delay the clock signals. Hence, operating temperatures and process delays that affect the electrical components may also be reduced.

The delayed complementary clock signals also permit data to be latched on a rising edge of one of the clock signals in a given period and then on a rising edge of the other clock signal in the next period. Hence, the synchronous clock generator may eliminate a dependency on the duty cycle of an input clock signal.

Figure 1:
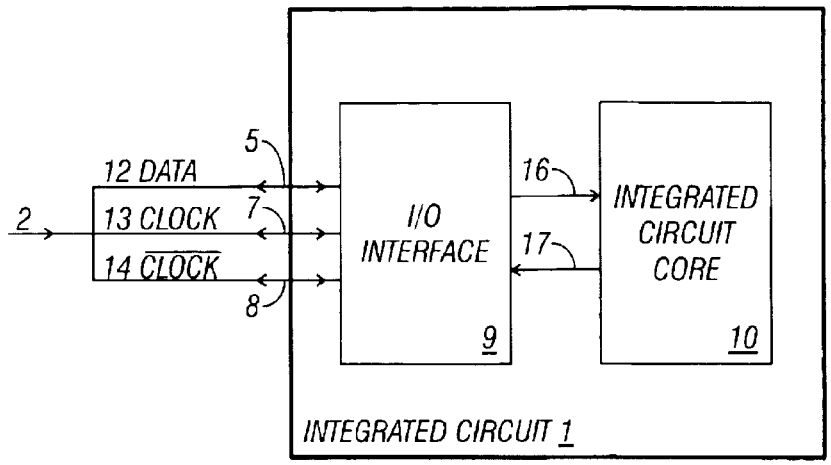
FIG. 1 illustrates a simplified block diagram of an integrated circuit with an input/output interface and an integrated circuit core.

FIG. 1 illustrates a simplified block diagram of an integrated circuit 1 including an input/output interface 9 and an integrated circuit core 10. Signals may be exchanged between the core 10 and the input/output interface 9 using channels 16 and 17. The integrated circuit 1 may receive an input signal 2 at the input/output interface 9. The input signal 2 may include a data signal (DATA) 12, a clock signal (CLOCK) 13, and a clock signal ($\overline{\text{CLOCK}}$) 14. The clock signals 13 and 14 may be complementary. The input signal 2 may be transmitted onto distinct channels. The channels may include a data channel 5, a clock channel 7, and a clock channel 8.

Figure 2:
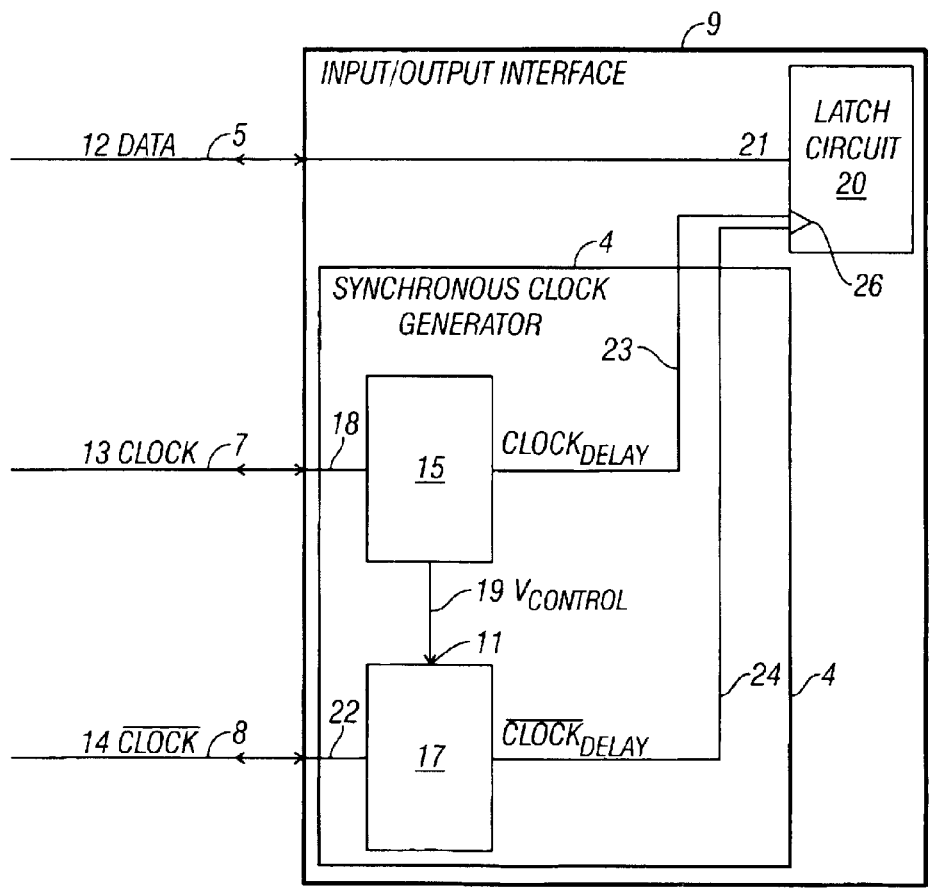
FIG. 2 illustrates a circuit diagram of the input/output interface of FIG. 1 with a synchronous clock generator.

FIG. 2 illustrates the input/output interface 9 having a synchronous clock generator 4 and a latch circuit 20 coupled to the data channel 5. The input signal 12 may be fed to an input 21 of the latch circuit 20. The clock generator 4 may also include a delay lock loop circuit 15 coupled to the clock channel 7 and a delay circuit 17 coupled to the clock channel 8. The delay lock loop circuit 15 adjusts the delay of the clock signal 13 arriving at an input 18 and produces a control signal 19 ($V_{control}$) on an output 37 (FIG. 3) that is fed to an input 11 of the delay circuit 17. The control signal 19 ($V_{control}$) causes the delay circuit 17 to delay the clock signal 14 received on an input 22. The output 23 ($\text{CLOCK}_{delay}$) of the delay lock loop circuit 15 and the output 24 ($\overline{\text{CLOCK}}_{Delay}$) of the delay circuit 17 are each fed to an input 26 of the latch circuit 20.

Figure 3:
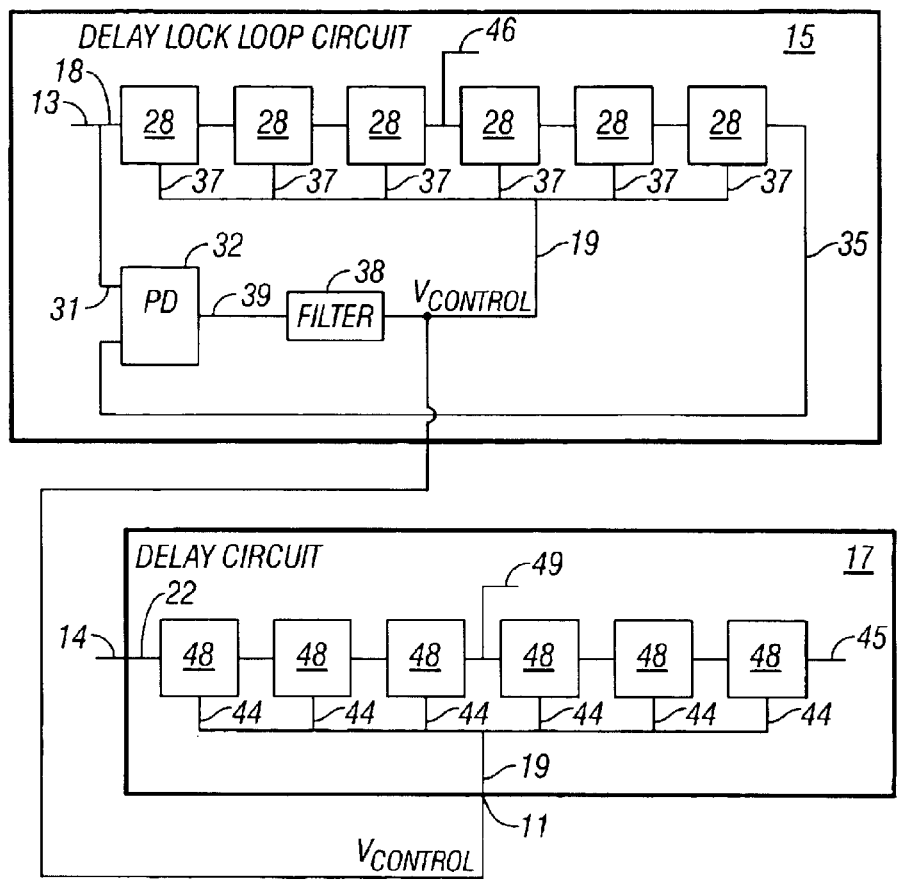
FIG. 3 illustrates a block diagram of a delay lock loop circuit and a delay circuit of the synchronous clock generator of FIG. 1.

FIG. 3 illustrates a block diagram of the delay lock loop circuit 15 and the delay circuit 17. The clock signal 13 is supplied to the input 18 of a series of delay cells 28 and to an input 31 of a phase detector 32. Each delay cell 28 operates as a delay stage to change the phase of the incoming clock signal 13. The clock signal 13 propagates through each delay cell 28 to generate an output signal 35. The output signal 35 is then delivered to an input 31 of the phase detector 32, which compares the phase of the clock signal 13 with the adjusted clock signal from the output 35. The output 39 of the phase detector 32 is then filtered by a filter 38 to produce the control signal 19, which is applied to each input 37 of each delay cell 28. The control signal 19 may be used to adjust a voltage of each delay cell 28. This in turn may cause the delay cell to change the delay of the clock signal 13. The output 35 is continuously compared to the clock signal 13 until an adequate phase delay is reached.

When the clock signal 13 is sufficiently delayed, a center tap 46 of the delay lock loop circuit 15 may be used to supply the input 23 to the latch circuit 20. The delay lock loop circuit 15 may also be tapped at any other delay stage.

The delay circuit 17 receives the clock signal 14 at the input 22 of a series of delay cells 48. Each delay cell 48 receives the control signal 19 at an input 44 via the input 11. The control signal 19 causes the delay cells 48 to delay the clock signal 14 by substantially the same phase as the clock signal 13. The control signal 19 may be fed to each delay cell 48 each time the signal 19 is produced by the phase detector 32. Alternatively, the control signal 19 may be supplied to each of the delay cells 48 when the clock signal 13 is sufficiently delayed. Once the appropriate delay of the clock signal 14 is produced, a center tap 49 may be used to provide the input 24 to the latch circuit 20. The delay circuit 17 may also be tapped at any other delay stage corresponding to a delay stage of the delay lock loop circuit 15.

Figure 4:
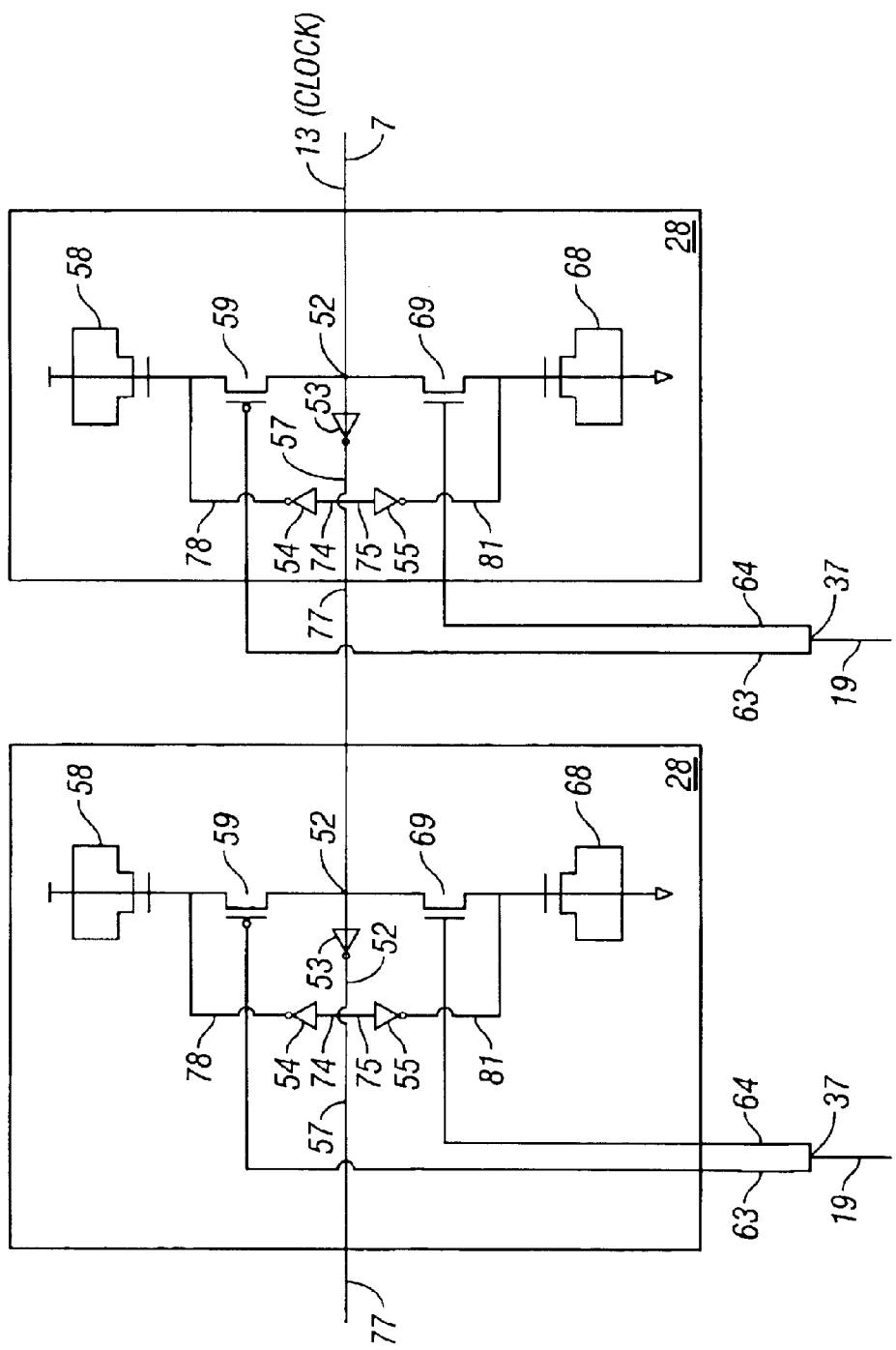
FIG. 4 illustrates a delay cell of the delay lock loop circuit of FIG. 3.

FIG. 4 is a circuit diagram showing an example of two delay cells 28 of the delay lock loop circuit 15. The operation or configuration of the delay cells 48 may be similar to or identical to the delay cells 28. Each delay cell 28 includes an inverter circuit 53, inverters 54 and 55, and transistors 58, 59, 68 and 69.

The first delay cell 28 receives the clock signal 13 on an input 52, which is supplied to the inverter circuit 53 by clock channel 7. The output 57 of the inverter circuit is fed to an input 74 of the inverter 54 and an input 75 of the inverter 55. An output 78 of the inverter 54 is transmitted to the transistor 59, and an output 81 of the inverter 55 is fed to the transistor 69. The drain terminals of the transistors 59 and 69 may be coupled to the input 52 of the inverter circuit 53. The transistors 58 and 68 may be coupled to the transistors 59 and 69, respectively.

The control signal 19 received on the input 37 may be divided into two distinct signals 63 and 64. The signal 63 may bias the drain terminal of the transistor 59, and the signal 64 may bias the drain terminal of the transistor 69 to drive the inverter circuit 53 to generate an output 77, which serves as the input for the next delay cell 28.

A sufficient delay of the input signal 13 may be achieved as follows. Prior to a reset operation of, for example, an integrated circuit, the signals 63 and 64 may be coupled to power and ground, respectively. This isolates the transistors 59 and 69 from the input 52 and also forces a lock time of the delay lock loop to be at a minimum value. An amount of time required for the delay lock loop circuit 15 to sufficiently delay the input signal 13 may then be calculated using the minimum value and a pole of the filter 38.

Figure 5:
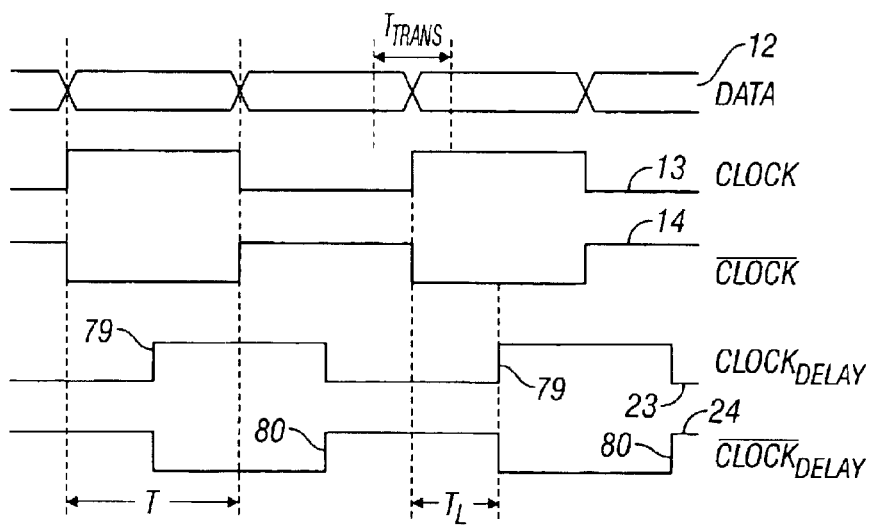
FIG. 5 is a timing diagram illustrating an operation of an integrated circuit configured with the synchronous clock generator of FIG. 3.

FIG. 5 is a timing diagram illustrating an example of phase delays produced by the synchronous clock generator 8. The clock signals 13 (CLOCK) and 14 ($\overline{\text{CLOCK}}$) may be complementary and may have substantially the same period (T). The data signal 12 (DATA) received on the channel 5 may also have the same period as the signals 13 and 14. FIG. 5 also shows that the output signal 23 (CLOCK$_{Delay}$) and the output signal 24 ($\overline{\text{CLOCK}}_{Delay}$) may be delayed by a period ($T_L$) relative to the input clock signals 13 and 14. The delay permits the data signal 12 to be latched on a rising edge 79 of the clock signal 13 or the rising edge 80 of the clock signal 14 at a time ($T_L$), after the transient time ($T_{trans}$) of the signal 12.

A number of embodiments of the invention have been described. Nevertheless, it will be understood that various modifications may be made without departing from the spirit and scope of the invention. For example, more than one delay circuit 17 may be controlled by the delay lock loop circuit 15 to delay input clock signals. Accordingly, other embodiments are within the scope of the following claims.

What is claimed is:

1. A device, comprising:
   a delay lock loop circuit responsive to an input signal to delay the input signal by a first period and to generate an analog control signal having an amplitude;
   a delay circuit coupled to the delay lock loop circuit and responsive to the input signal, the delay circuit being responsive to the analog control signal from the delay lock loop circuit to delay the input signal by a second period as a function of the analog control signal amplitude, the input signal comprising a first clock signal and a second clock signal; and
   a latch circuit coupled to the delay lock loop circuit and the delay circuit, the latch circuit being responsive to at least one of a first delayed clock signal from the delay lock loop circuit and a second delayed clock signal from the delay circuit to latch a data signal.

2. A device, comprising:
   a delay lock loop circuit responsive to an input signal to delay the input signal by a first period and to generate an analog control signal having an amplitude; and
   a delay circuit coupled to the delay lock loop circuit and responsive to the input signal, the delay circuit being responsive to the analog control signal from the delay lock loop circuit to delay the input signal by a second period as a function of the analog control signal amplitude, wherein the input signal comprises complementary input clock signals.

3. The device of claim 2, wherein the first period and the second period are substantially the same.

4. The device of claim 2 further comprising a first input channel coupled to the delay lock loop circuit and a second input channel coupled to the delay circuit.

5. The device of claim 2, wherein the delay lock loop circuit further comprises:
   at least one delay cell; and
   a phase detector responsive to the input signal and responsive to an output signal from the at least one delay cell to produce a control signal.

6. The device of claim 2, wherein the delay circuit further comprises at least one delay cell responsive to the control signal from the delay lock loop circuit.

7. The device of claim 2, further comprising;
   a latch circuit having a first input to receive an input data signal and a second input to receive at least one of an output from the delay circuit and an output from the delay lock loop circuit.

8. The device of claim 7, wherein the delay lock loop circuit comprises a center tap.

9. A device, comprising:
   a delay lock loop circuit responsive to a first clock signal of an input signal to delay the first clock signal by a first period and to generate an analog control signal having an amplitude;
   a delay circuit coupled to the delay lock loop circuit and responsive to a second clock signal of the input signal, the delay circuit being responsive to the analog control signal from the delay lock loop circuit to delay the second clock signal by a second period as a function of the analog control signal amplitude; and
   a latch circuit coupled to the delay lock loop circuit and the delay circuit, the latch circuit being responsive to at least one of a first delayed clock signal from the delay lock loop circuit and a second delayed clock signal from the delay circuit to latch a data signal.

10. A device, comprising:
    a delay lock loop circuit responsive to a first input signal to delay the first input signal by a first period and to generate an analog control signal having an amplitude; and
    a delay circuit coupled to the delay lock loop circuit and responsive to a second input signal, the delay circuit being responsive to the analog control signal from the delay lock loop circuit to delay the second signal by a second period as a function of the analog control signal amplitude, wherein the first signal and the second signal comprise complementary clock signals.

11. The device of claim 10 further comprising a latch circuit, the latch being responsive to at least one of an output of the delay lock loop circuit and an output of the delay circuit.

12. The device of claim 10 wherein the delay lock loop circuit comprises at least one delay cell.

13. The device of claim 11, wherein the delay circuit further comprises at least one delay cell responsive to the control signal from the delay lock loop circuit.

14. A method, comprising:
   receiving an input signal comprising a first clock signal and a second clock signal;
   using a delay lock loop circuit to delay the first clock signal by a first period;
   controlling the first period as a function of an analog control signal having an amplitude;
   using a delay circuit to delay the second clock signal by a second period in response to the analog control signal amplitude from the delay lock loop circuit; and
   latching a data signal in response to at least one of a first delayed clock signal from the delay lock loop circuit and a second delayed clock signal from the delay circuit.

15. A method, comprising:
   receiving an input signal comprising a first clock signal and a second clock signal;
   using a delay lock loop circuit to delay the first clock signal by a first period;
   controlling the first period as a function of an analog control signal having an amplitude;
   using a delay circuit to delay the second clock signal by a second period in response to the analog control signal amplitude from the delay lock loop circuit;
   wherein said using the delay lock loop circuit comprises configuring the delay lock loop circuit with at least one delay cell; and
   latching a data signal in response to at least one of a first delayed clock signal from the delay lock loop circuit and a second delayed clock signal from the delay circuit.

16. A method, comprising:
   receiving a first signal and a second signal;
   using a delay lock loop circuit to delay the first signal by a first period;
   controlling the first period as a function of an analog control signal having an amplitude;
   using a delay circuit to delay the second signal by a second period in response to the analog control signal amplitude from the delay lock loop circuit; and
   activating a latch circuit in response to at least one of an output from the delay lock loop circuit and an output from the delay circuit.

17. The method of claim 16, wherein the receiving the first signal and the second signal further comprises receiving a first clock signal and a second clock signal.

18. The method of claim 16, wherein the receiving the first signal and the second signal further comprises receiving a first clock signal and a second clock signal and the method further comprising activating a latch circuit on a rising edge of one of the first delayed clock signal and the second delayed clock signal.

19. The method of claim 16, wherein the first period and the second period are substantially the same.

20. The method of claim 16, wherein the using the delay circuit further comprises configuring the delay circuit with at least one delay cell and using the control signal to adjust the at least one delay cell.

* * * * *